United States Patent
Lin et al.

(10) Patent No.: US 9,548,283 B2
(45) Date of Patent: Jan. 17, 2017

(54) PACKAGE REDISTRIBUTION LAYER STRUCTURE AND METHOD OF FORMING SAME

(75) Inventors: Tsung-Shu Lin, New Taipei (TW); Hung-Jui Kuo, Hsin-Chu (TW); Yi-Wen Wu, Xizhi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/542,528

(22) Filed: Jul. 5, 2012

(65) Prior Publication Data

US 2014/0008785 A1    Jan. 9, 2014

(51) Int. Cl.
| | |
|---|---|
| H01L 29/49 | (2006.01) |
| H01L 23/00 | (2006.01) |
| H01L 23/538 | (2006.01) |
| H01L 25/10 | (2006.01) |
| H01L 23/31 | (2006.01) |
| H01L 25/16 | (2006.01) |

(52) U.S. Cl.
CPC ........... *H01L 24/73* (2013.01); *H01L 23/5389* (2013.01); *H01L 25/105* (2013.01); *H01L 23/3121* (2013.01); *H01L 25/16* (2013.01); *H01L 2224/16225* (2013.01); *H01L 2224/32225* (2013.01); *H01L 2224/73204* (2013.01); *H01L 2225/107* (2013.01); *H01L 2924/0002* (2013.01); *H01L 2924/1461* (2013.01); *H01L 2924/181* (2013.01)

(58) Field of Classification Search
CPC ............................... H01L 27/73; H01L 25/105
USPC .......................... 257/686, 723, 777, E23.125, E25.001,257/E25.006, E25.018, E25.021, E25.027, 735,257/736, 787, 789, 784, 778
See application file for complete search history.

(56) References Cited

U.S. PATENT DOCUMENTS

| | | | | |
|---|---|---|---|---|
| 5,243,141 A | * | 9/1993 | Yonehara | H01L 23/49572 174/260 |
| 6,188,127 B1 | * | 2/2001 | Senba et al. | 257/686 |
| 6,333,562 B1 | * | 12/2001 | Lin | 257/777 |
| 7,291,906 B2 | * | 11/2007 | Cha et al. | 257/686 |
| 7,535,086 B2 | * | 5/2009 | Merilo et al. | 257/676 |
| 7,638,365 B2 | * | 12/2009 | Jeong et al. | 438/109 |
| 7,692,931 B2 | * | 4/2010 | Chong et al. | 361/790 |
| 7,696,629 B2 | * | 4/2010 | Lin et al. | 257/777 |
| 7,718,472 B2 | * | 5/2010 | Merilo et al. | 438/109 |
| 7,808,093 B2 | * | 10/2010 | Kagaya et al. | 257/686 |
| 7,811,861 B2 | * | 10/2010 | Huang et al. | 438/116 |
| 7,825,504 B2 | * | 11/2010 | Kim | 257/686 |
| 8,022,523 B2 | * | 9/2011 | Chen et al. | 257/686 |
| 8,063,493 B2 | * | 11/2011 | Boon et al. | 257/777 |
| 8,134,227 B2 | * | 3/2012 | Tay | H01L 25/03 257/685 |

(Continued)

*Primary Examiner* — Michael Shingleton
(74) *Attorney, Agent, or Firm* — Slater Matsil, LLP

(57) ABSTRACT

A package-on-package (PoP) device comprises a bottom package on a substrate and a first set of conductive elements coupling the bottom package and the substrate. The PoP device further comprises a top package over the bottom package and a redistribution layer coupling the top package to the substrate. A method of forming a PoP device comprises coupling a first package to a substrate; and forming a redistribution layer over the first package and a top surface of the substrate. The method further comprises coupling a second package to the redistribution layer, wherein the redistribution layer couples the second package to the substrate.

22 Claims, 7 Drawing Sheets

(56) References Cited

U.S. PATENT DOCUMENTS

| | | | |
|---|---|---|---|
| 8,241,954 B2* | 8/2012 | Camacho et al. | 438/108 |
| 8,436,462 B2* | 5/2013 | Kim et al. | 257/693 |
| 8,466,997 B2* | 6/2013 | Goh et al. | 348/340 |
| 8,497,534 B2* | 7/2013 | Liu et al. | 257/276 |
| 8,513,057 B2* | 8/2013 | Kim et al. | 438/106 |
| 8,525,331 B2* | 9/2013 | Ilzer et al. | 257/737 |
| 8,525,348 B2* | 9/2013 | Chang et al. | 257/777 |
| 8,546,188 B2* | 10/2013 | Liu et al. | 438/109 |
| 8,546,929 B2* | 10/2013 | Ong et al. | 257/686 |
| 8,546,945 B2* | 10/2013 | Kuo et al. | 257/757 |
| 8,552,557 B1* | 10/2013 | Nangalia et al. | 257/738 |
| 8,557,636 B1* | 10/2013 | Patel | 438/109 |
| 8,592,311 B2* | 11/2013 | Lin et al. | 438/667 |
| 2008/0122113 A1* | 5/2008 | Corisis et al. | 257/777 |
| 2008/0230922 A1* | 9/2008 | Mochizuki et al. | 257/777 |
| 2011/0221073 A1* | 9/2011 | Sasaki et al. | 257/777 |
| 2012/0061851 A1* | 3/2012 | Rathburn | 257/774 |
| 2013/0175706 A1* | 7/2013 | Choi et al. | 257/777 |
| 2013/0221543 A1* | 8/2013 | Choi et al. | 257/777 |
| 2013/0241081 A1* | 9/2013 | Sasaki et al. | 257/777 |
| 2013/0256919 A1* | 10/2013 | Scholz et al. | 257/777 |
| 2014/0008785 A1* | 1/2014 | Lin et al. | 257/737 |
| 2015/0021791 A1* | 1/2015 | Park et al. | 257/777 |

* cited by examiner

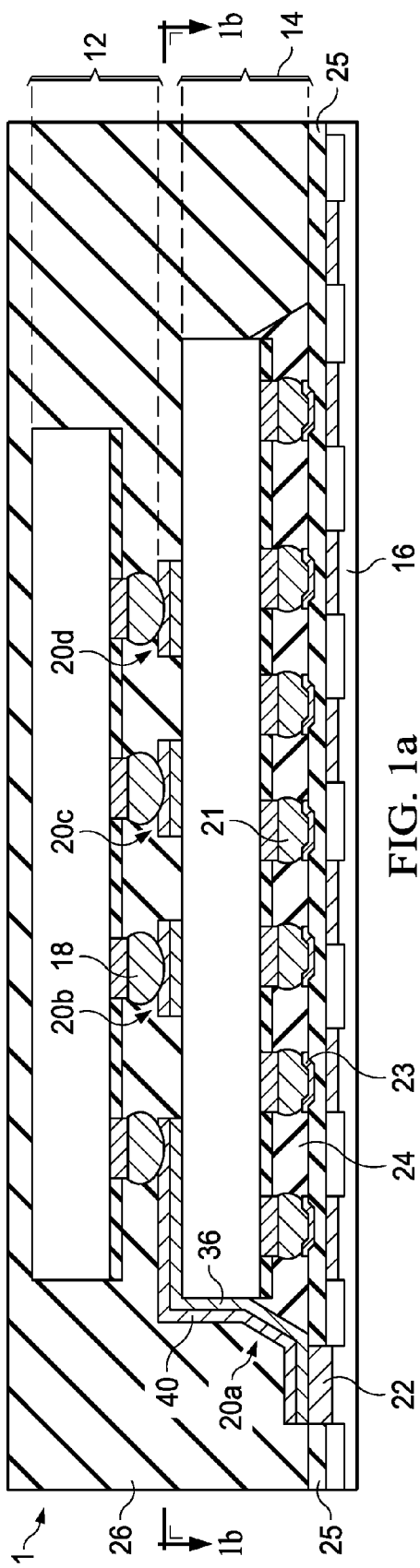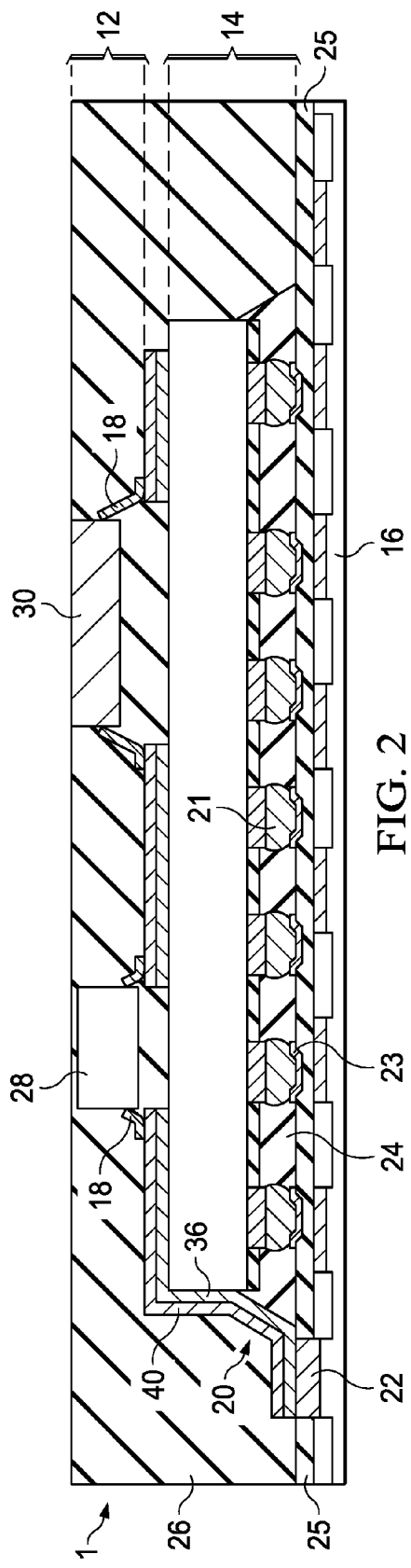

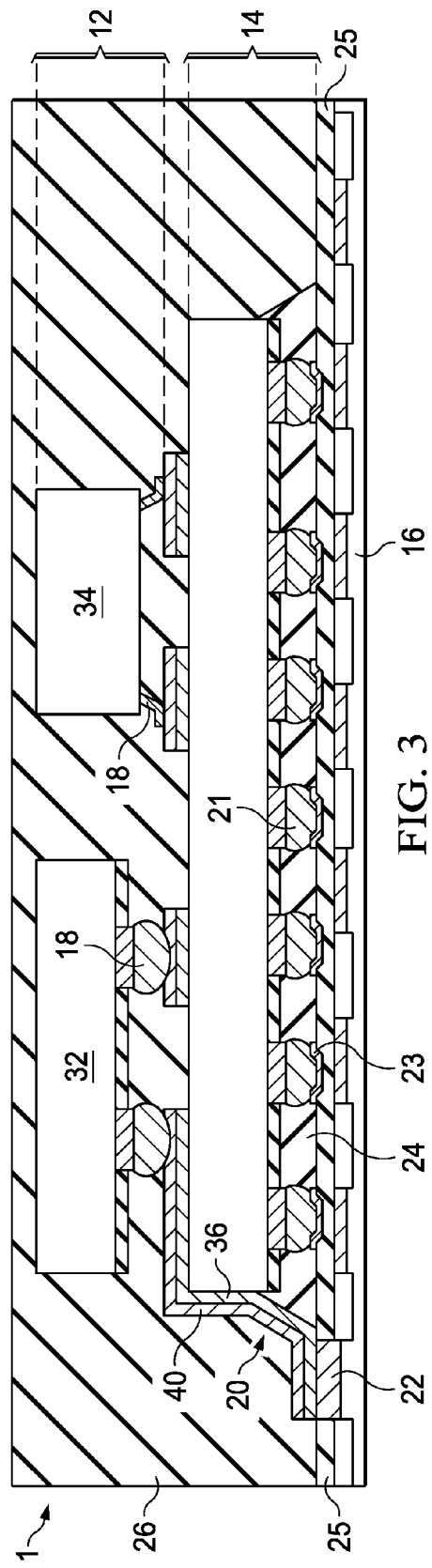
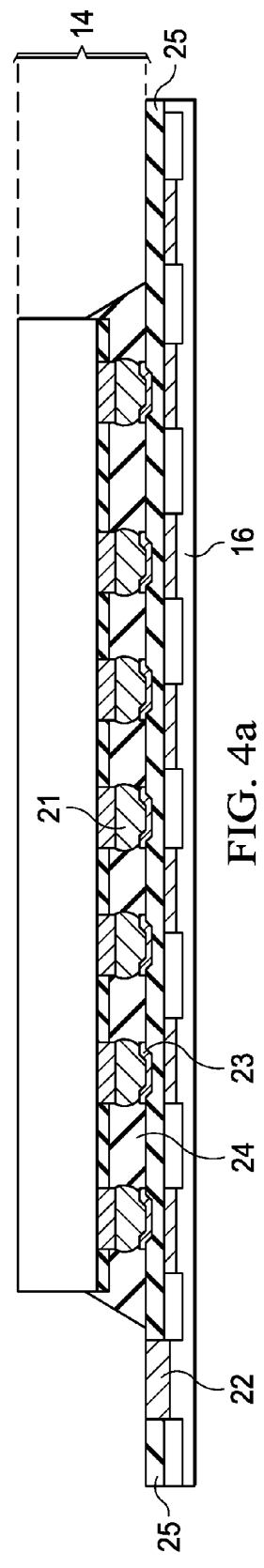

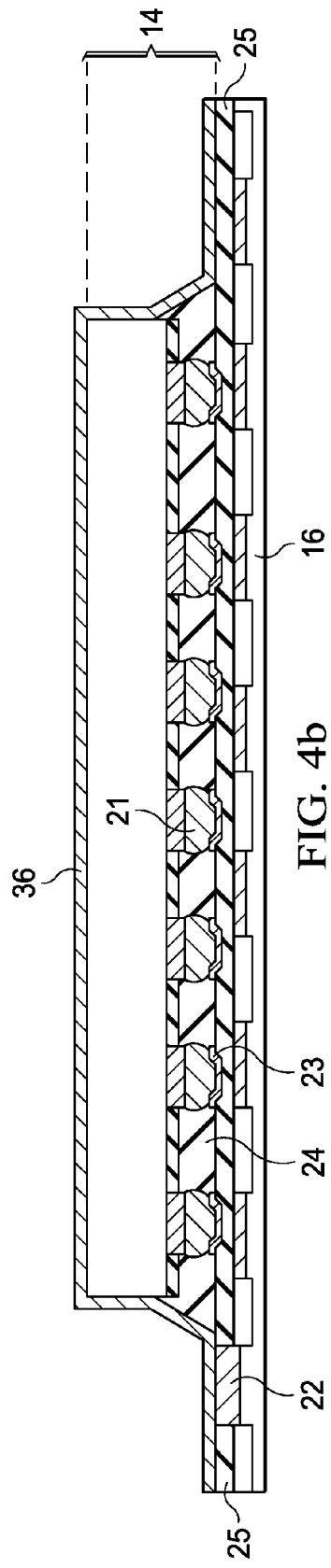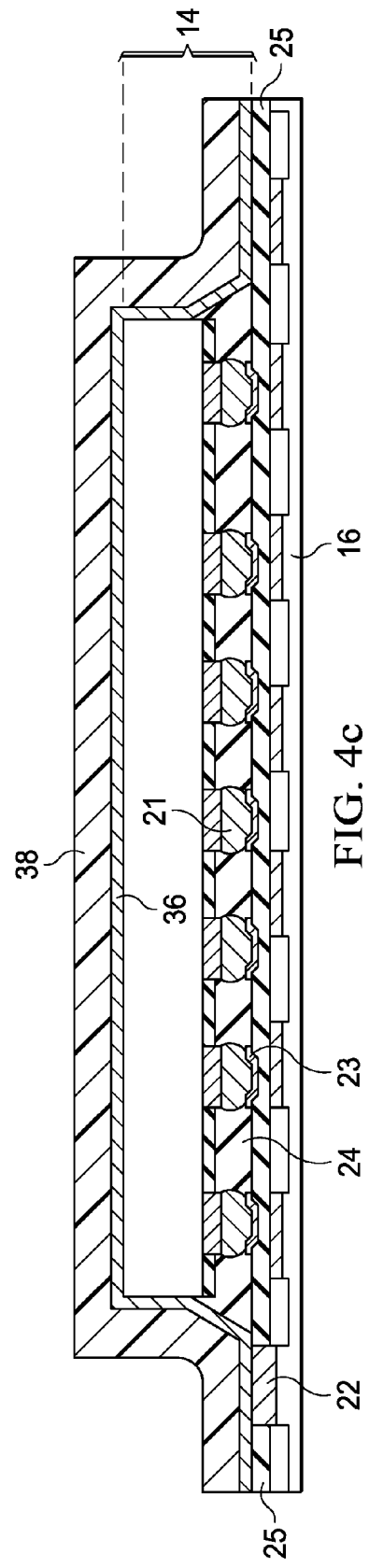

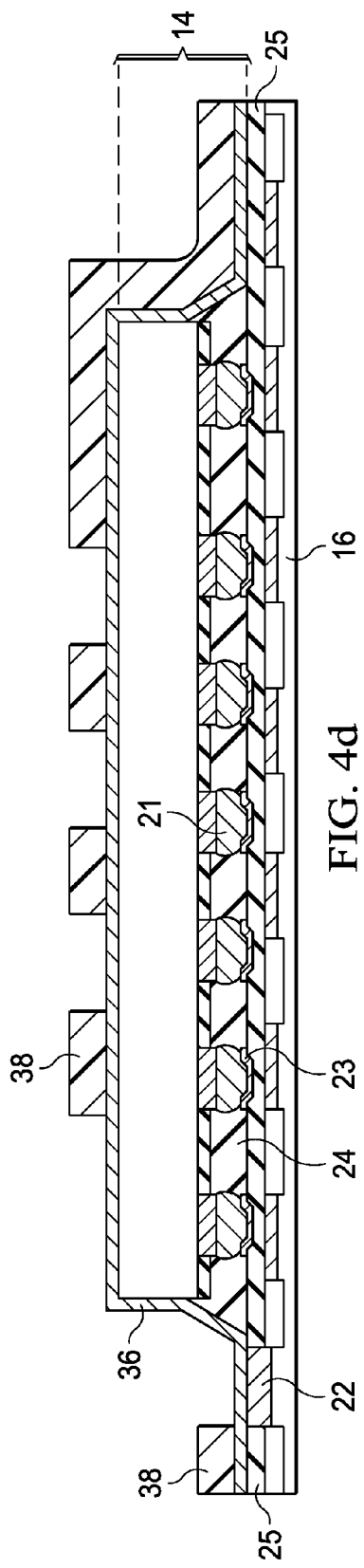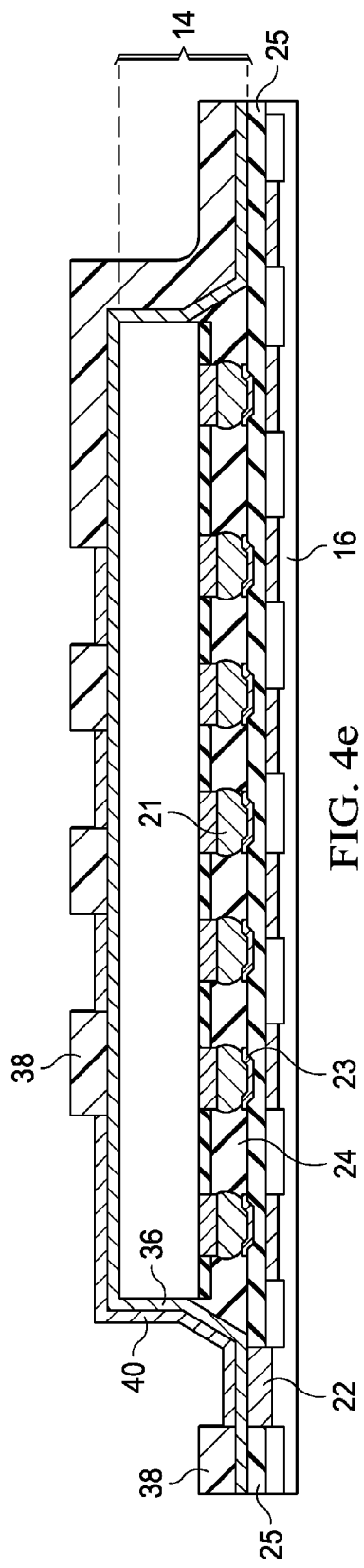

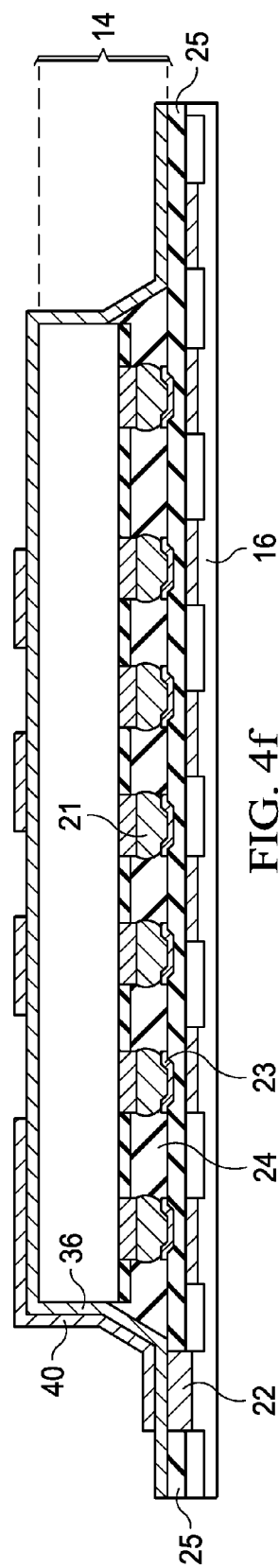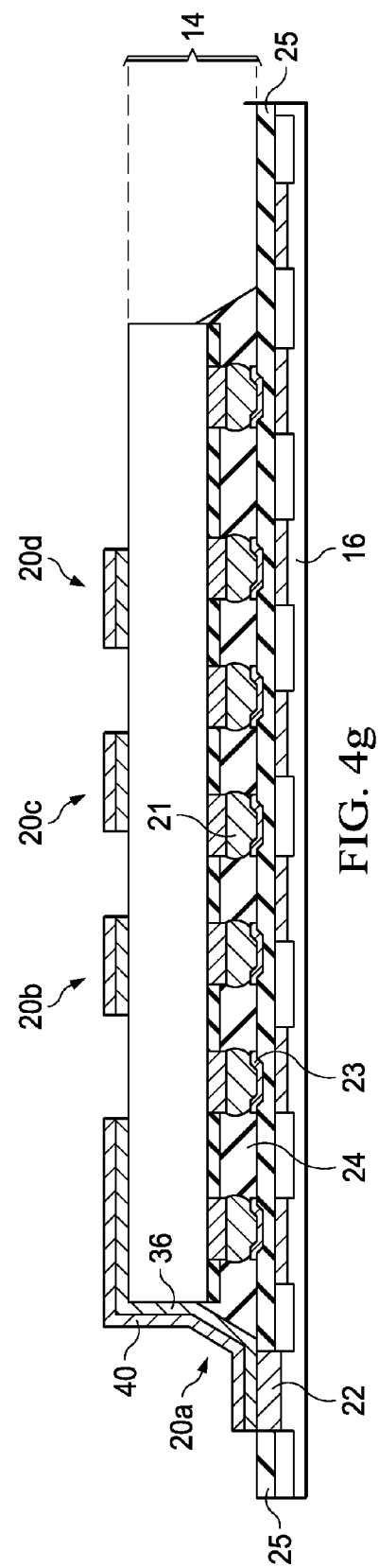

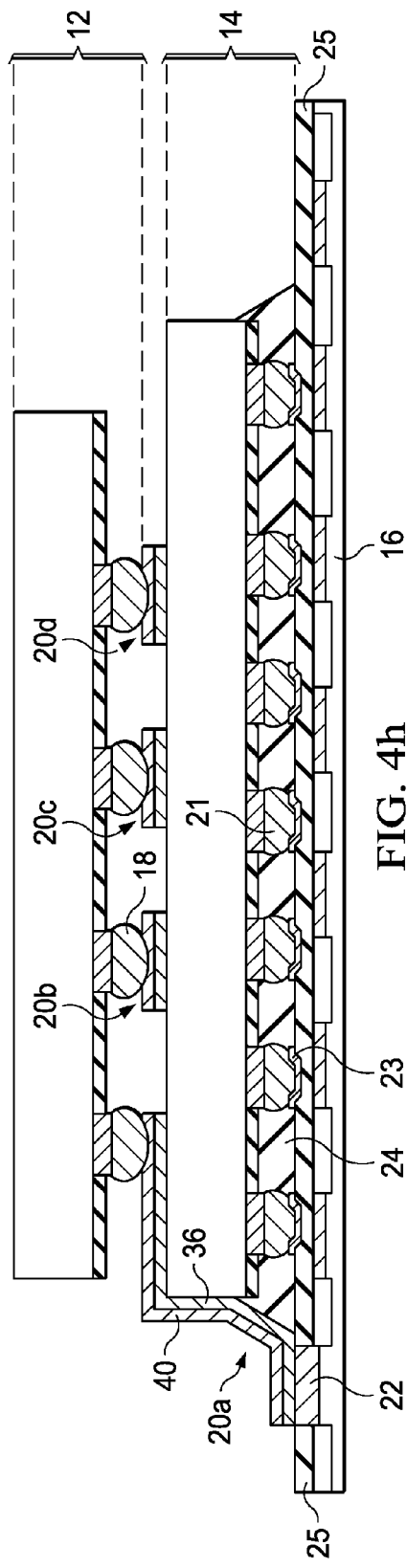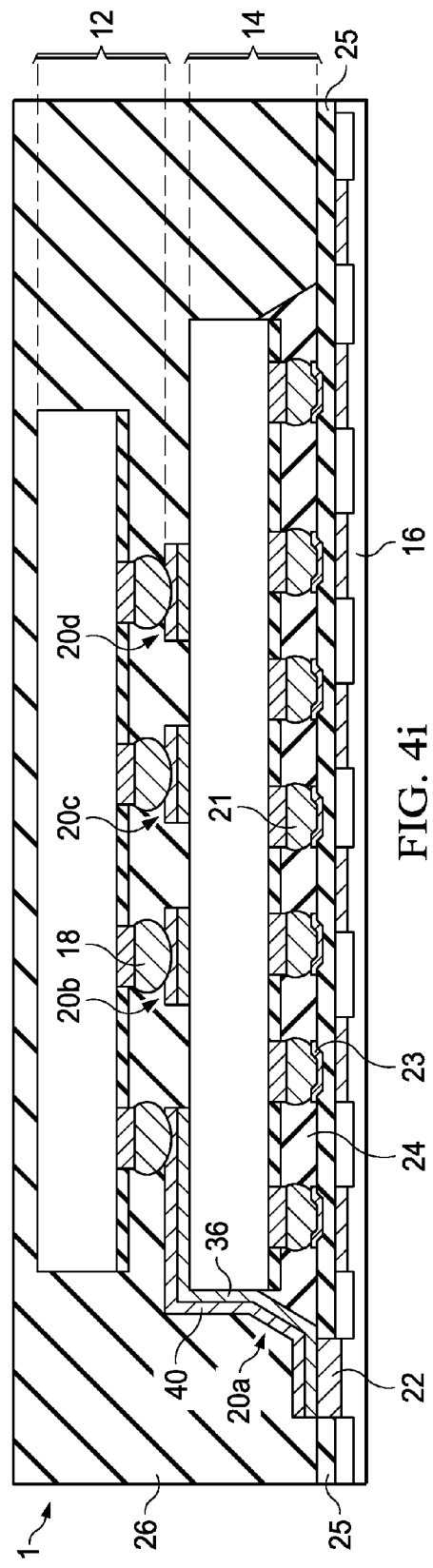

PACKAGE REDISTRIBUTION LAYER STRUCTURE AND METHOD OF FORMING SAME

BACKGROUND

Electronics can be divided into a simple hierarchy consisting of devices such as integrated circuit (IC) chips, packages, printed circuit boards (PCB), and a system. The package is the interface between an electronic device, such as a computer chip, and a PCB. Devices are made from semiconductor materials such as silicon. Integrated circuits are assembled into a package such as a quad flat pack (QFP), pin grid array (PGA), or ball grid array (BGA), using wire bonding (WB), tape automated bonding (TAB), or flip chip (FC) bumping assembly techniques. The packaged device is then attached either directly to a printed wiring board or to another type of substrate, which is defined as the second level of packaging.

Ball grid array (BGA) packaging technology generally is an advanced semiconductor packaging technology, which is characterized in that a semiconductor chip is mounted on a front surface of a substrate, and a plurality of conductive elements such as solder balls are arranged in a matrix array, customarily referred to as ball grid array, on a back surface of the substrate. The ball grid array allows the semiconductor package to be bonded and electrically connected to an external PCB or other electronic devices. The BGA package may be employed in a memory such as Dynamic Random Access Memory and others.

A basic flip-chip (FC) packaging technology comprises an IC, an interconnect system, and a substrate. A function chip is connected to the substrate with a plurality of solder bumps, wherein the solder bumps form a metallurgical interconnection between the chip and the substrate. The function chip, the solder bump, and the substrate form a flip-chip package. Further, a plurality of balls form a ball grid array (BGA).

Wire bonding can be used to make the electrical connections from chip components such as chip resistors or chip capacitors to a substrate. Two function chips are stacked on top of a plurality of substrate layers. The chips are connected to the substrate by a plurality of bonding gold wires. Other form of wires such as aluminum wire can be used, too. The function chips, the gold wire, and the substrate form a wire bonding (WB) package.

Package-on-Package (PoP) is an integrated circuit packaging technique to allow vertically combining, for example, discrete logic and memory ball grid array (BGA) packages. Two or more packages are installed on top of one another, e.g. stacked, with a standard interface to route signals between them. This allows higher density, for example in the mobile telephone/PDA market.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1a and 1b illustrate a cross section and a top down view, respectively, of a package-on-package (PoP) device according to an embodiment;

FIG. 2 illustrates a cross section of a PoP device according to another embodiment;

FIG. 3 illustrates a cross section of a PoP device according to another embodiment; and FIGS. 4a through 4i illustrate a process of forming the PoP device of FIGS. 1a and 1b according to an embodiment.

DETAILED DESCRIPTION OF ILLUSTRATIVE EMBODIMENTS

Figure 1B:
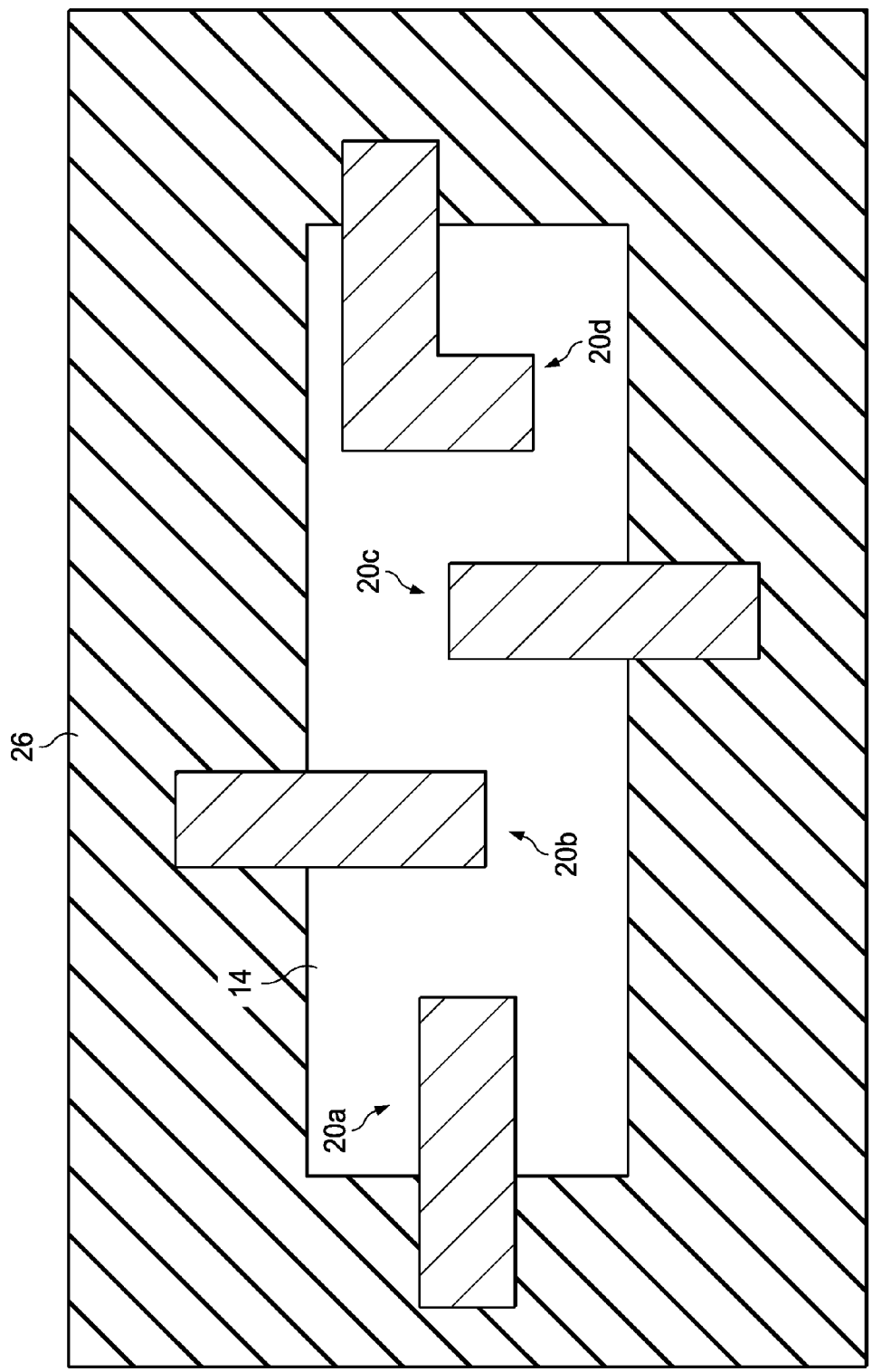

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a redistribution layer (RDL) structure for a package-on-package structure, a three-dimensional integrated circuit (3DIC) package, a two-and-a-half integrated circuit (2.5DIC) package, or the like. Other embodiments may also be applied, however, to other structures in which electrical connections can be formed between substrates.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

FIGS. 1a and 1b illustrate an embodiment of a PoP device 1 including a top package 12, a bottom package 14, a substrate 16, and a redistribution layer (RDL) 20 coupling the top package 12 to a first surface of the substrate 16. FIG. 1b illustrates a top down view along line 1b-1b of FIG. 1a. The substrate 16 may be, for example, a silicon substrate (such as a silicon chip), a silicon or glass interposer, a printed circuit board (PCB), an organic laminate substrate, or the like.

The RDL 20 may be on a top surface and sidewalls of the bottom package 14. The top package 12 may be attached to the RDL 20 by connector elements 18 such as, for example, controlled collapse chip connection (C4) bumps, microbumps, metal to metal bonding, or the like. The RDL 20 may be attached to a contact 22 in the substrate 16. The RDL 20 may comprise a seed layer 36 and a conductive layer 40 as illustrated in FIG. 1a. In an embodiment, the RDL 20 may comprise a under bump metallization (UBM) to engage with a connector element 18. Embodiments contemplate a RDL 20 having only a single layer or more than two layers. In an embodiment, each connector element 18 of the top package 12 may have an electrically and physically separate RDL 20 (see RDLs 20a, 20b, 20c, and 20d) connecting to separate contacts 22 on the first surface of the substrate 16. In another embodiment, two or more of the connector elements 18 may share a RDL 20. Although the cross section of the embodiment illustrated in FIG. 1a only shows RDL 20a on one sidewall of the bottom package 14, embodiments contemplate that RDLs 20 may be on all four sidewalls of the bottom package 14 (e.g., see FIG. 1b).

The bottom package 14 may be attached to the first surface of the substrate 16 by connector elements 21 such as, for example, C4 bumps, microbumps, or the like. The first surface of the substrate 16 may include UBM 23 and a passivation layer 25. The UBM 23 may be configured to engage with the connector elements 21 of the bottom package 14. The combination of a connector element 18, a RDL 20, a contact 22, a connector element 21, a UBM 23, and metallization layers in substrate 16 may provide interconnection between the top package 12 and the bottom package 14 to form functional circuitry.

An underfill 24 may be between the bottom package 14 and the first surface of substrate 16 and around the connector elements 21. Embodiments contemplate that an underfill 24 may be used between the top package 12 and the bottom package 14 and around the connector elements 18. A molding compound 26 encapsulates the top package 12 and the bottom package 14 on the first surface of the substrate 16.

FIG. 2 illustrates another embodiment of a PoP device 1 wherein instead of a single top package 12, the top package 12 includes two components 28 and 30. The PoP device 1 comprises a first component 28, a second component 30, a bottom package 14, and a substrate 16. In an embodiment, the first component 28 may be passive components and the second component 30 may be a microelectromechanical systems (MEMS) sensor. The first and second components 28 and 30 may be attached to the RDL 20 by connector elements 18. In an embodiment, the connector elements 18 may comprise wire leads, wire joints, or the like. In another embodiment, the connector elements 18 may comprise C4 bumps, microbumps, or the like. Although the embodiment in FIG. 2 shows the top package 12 comprises two packages, embodiments contemplate the top package 12 comprising more than two components.

FIG. 3 illustrates yet another embodiment of the PoP device 1 wherein the top package 12 includes a package 32 and a component 34, such as a capacitor or resistor, for example. The package 32 may be attached to the RDL 20 by connector elements 18 such as, for example, C4 bumps, microbumps, or the like. In an embodiment, the component 34 may be attached to the RDL 20 by connector elements such as, for example, wire leads, wire joints, or the like. In another embodiment, the component 34 may be attached to the RDL 20 by connector elements such as, for example, C4 bumps, microbumps, or the like.

FIGS. 4a through 4i illustrate a process to form a PoP device 1 according to an embodiment. Although this embodiment is discussed with steps performed in a particular order, steps may be performed in any logical order.

FIG. 4a illustrates a bottom package 14 and a substrate 16 at an intermediate stage of processing. The substrate 16 may be a silicon substrate (such as a silicon chip), a silicon or glass interposer, a PCB, an organic laminate substrate, or the like.

The substrate 16 may include metallization layers (not shown). The metallization layers may be designed to connect the top package 12 and the bottom package 14 to form functional circuitry. The metallization layers (not shown) may be formed of alternating layers of dielectric (e.g., low-k dielectric material) and conductive material (e.g., copper) and may be formed through any suitable process (such as deposition, damascene, dual damascene, etc.). The metallization and dielectric layers may include metal lines and vias (not shown) to electrically couple the top package 12 and the bottom package 14 (see FIG. 1a). Only a portion of the substrate 16 is illustrated in the figures, as this is sufficient to fully describe the illustrative embodiments.

The passivation layer 25 may be formed on the first surface of the substrate 16 and may generally protect the substrate 16. The passivation layer 25 may comprise a passivating oxide, silicon nitride, silicon nitrogen oxide, silicon oxide, the like, or a combination thereof. Other layers, such as a polymeric layer formed from polybenzoxaxole, may be used in addition to, or instead of, the passivation layer 25.

The contacts 22 and the UBMs 23 may be formed on the first surface of the substrate 16. The contacts 22 may be formed over and in electrical contact with the metallization layers in the substrate 16. The contacts 22 may comprise copper, aluminum, aluminum copper, tungsten, nickel, the like, or a combination thereof. The contacts 22 may be formed using a single and/or a dual damascene process. The contacts 22 may be deposited by chemical vapor deposition (CVD), atomic layer deposition (ALD), physical vapor deposition (PVD), the like, or a combination thereof. A polishing and/or grinding process, such as a chemical mechanical polish (CMP), can remove excess conductive materials.

Although not shown, the substrate 16 may also have connector elements formed on a backside (second surface) of the substrate 16 to allow PoP device 1 to be electrically coupled to other devices. These connector elements may be bumps, bond pads, wire bonds, or the like.

After the formation of the passivation layer 25, the UBMs 23 may be formed. The UBMs 23 allow the bottom package 14 to be electrically coupled to the subsequently placed top package 12 by way of the connector elements 21, the metallization layers in the substrate 16, the contacts 22, the RDL 20, and the connector elements 18 (see FIG. 1a). Openings for the UBMs 23 may be formed through the passivation layer 25 to expose at least a portion of an underlying metallization layer. The openings allow for electrical contact between the UBMs and the metallization layers in the substrate 16. The UBM openings may be formed using a suitable photolithographic mask and etching process, although any suitable process to expose portions of the metallization layers may alternatively be used.

Once the UBM openings are formed, the UBMs 23 may be formed in electrical contact with the metallization layers in the substrate 16. The UBMs 23 may comprise one or more layers of conductive material. There are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 23. Any suitable materials or layers of material that may be used for the UBMs 23 are fully intended to be included within the scope of the current application.

After the UBMs 23 are formed in the passivation layer 25, the bottom package 14 may be coupled to the substrate 16. In an embodiment the bottom package 14 may be coupled to the substrate 16 using a flip-chip bumping process between the connector elements 21 and the UBMs 23. In this embodiment, the connector elements 21 may be C4 bumps, microbumps, or the like and may comprise a material such as tin, silver, lead-free tin, copper, the like, or a combination thereof. In another embodiment, the bottom package 14 may be coupled to the substrate 16 by another chip bonding process that does not utilize the UBMs 23 in the substrate 16.

In an embodiment, the bottom package 14 may include several stacked chips (not shown) within the bottom package 14. The chips may be electrically coupled to each other through, for example, wire bonds. The chips may also be electrically coupled to contacts (not shown) in the bottom package 14 to allow the chips to be electrically coupled to the connector elements 21. In another embodiment, the bottom package 14 may include a single chip rather than several stacked chips. The bottom package 14 may also incorporate other chips, dies, or electronic circuitry depending on the intended used or performance needs of the PoP device 1.

Connecter elements 21 are shown disposed in an underfill 24, which may provide stress relief and protection for the connector elements 21. Underfill materials provide some stress relief and may include thermally conductive filler materials, to assist in handling mechanical stress from thermal expansion. Underfill 24 may comprise resins, epoxies, polymers, no flow underfill (NUF), capillary underfill, the like, or a combination thereof and may be injected between the bottom package 14 and the substrate 16.

In FIG. 4b, the formation of a seed layer 36 for the RDL 20 is illustrated. The seed layer 36 may be formed to extend along a top surface and sidewalls of the bottom package 14 and the first surface of the substrate 16. The seed layer 36 may comprise titanium, copper, the like, or a combination thereof and may be formed through CVD, sputtering, the like, or a combination thereof.

FIG. 4c illustrates the formation of a photo-sensitive material layer 38 on the seed layer 36. The photo-sensitive material layer 38 may comprise polybenzoxazole (PBO), SU-8 photo-sensitive epoxy, film type polymer materials and/or the like. In an embodiment, the photo-sensitive material layer 38 may be laminated to the seed layer 36 to assist in bonding the photo-sensitive material layer 38 to the seed layer 36.

In FIG. 4d, the patterning of the photo-sensitive material layer 38 is illustrated. The photo-sensitive material layer 38 may be patterned to form a plurality of openings in the photo-sensitive material layer 38. The patterning may be accomplished by exposing selective areas of the photo-sensitive material layer 38 to light. The physical properties of the photo-sensitive regions exposed to light change as a result. According to an embodiment, the change of the physical properties of the exposed regions will cause the exposed regions to be etched away when a developer solution is applied to the photo-sensitive material layer 38. As a result, the photo-sensitive material layer 38 is patterned as shown in FIG. 4d.

FIG. 4e illustrates the formation of the conductive layer 40 on the seed layer 36 in the openings in the photo-sensitive material layer 38. The conductive layer 40 may comprise copper, aluminum, aluminum copper, gold, the like, or a combination thereof. The conductive layer 40 may be formed on the seed layer 36 through a deposition process such as plating, CVD, PVD, the like, or a combination thereof.

In FIG. 4f, the removal of the remaining photo-sensitive material layer 38 is illustrated. The remaining portions of patterned photo-sensitive material layer 38 may be removed using, for example, an oxygen plasma or an ashing process. The removal of the remaining photo-sensitive material layer 38 may expose the underlying portions of the seed layer 36.

FIG. 4g illustrates the removal of the exposed portions of the seed layer 36. The removal of the exposed portions of the seed layer 36 may form a plurality of RDLs 20 (see RDLs 20a, 20b, 20c, and 20d; see also FIG. 1b) on the top surface and sidewalls of the bottom package 14. In an embodiment, the removal of exposed portions of the seed layer 36 may be performed by an etching process that may form UBMs in the RDLs 20 to engage the connector elements 18 of the top package 12. In another embodiment, the exposed portions of the seed layer 36 may be removed by an etch process to form contact areas on the RDLs 20.

In FIG. 4h, the bonding of the top package 12 to the RDLs 20 on the top surface of the bottom package 14 is illustrated. The connector elements 18 of the top package 12 and the RDLs 20 are brought together, and the connector elements 18 are then bonded to the RDLs 20. In an embodiment the top package 12 may be coupled to the RDLs 20 using a flip-chip bumping process between the connector elements 18 and UBMs in the RDLs 20. In this embodiment, the connector elements 18 may be C4 bumps, microbumps, or the like and may comprise a material such as tin, silver, lead-free tin, copper, the like, or a combination thereof. In another embodiment, the top package 12 may be coupled to RDLs 20 by another chip bonding process that does not utilize UBMs in the RDLs 20.

In an embodiment, the top package 12 may include several stacked chips (not shown) within the top package 12. The chips may be electrically coupled to each other through, for example, wire bonds. The chips may also be electrically coupled to contacts (not shown) in the top package 12 to allow the chips to be electrically coupled to the connector elements 18. In another embodiment, the top package 12 may include a single chip rather than several stacked chips. The top package 12 may also incorporate other chips, dies, or electronic circuitry depending on the intended used or performance needs of the PoP device 1.

FIG. 4i illustrates the formation of the molding compound 26 surrounding the top package 12, the bottom package 14, and the first surface of the substrate 16. The molding compound 26 may comprise a polymer, a molding underfill, the like, or a combination thereof. The molding compound 26 may be formed by injecting the molding compound 26 to surround the top package 12, the connector elements 18, the RDLs 20, the bottom package 14, and the underfill 24.

Although the process to form the PoP device 1 has been described with a plurality of RDLs 20, embodiments contemplate where there is only a single RDL 20.

Embodiments may achieve advantages. The direct coupling of the top package 12 to the bottom package 14 without a substrate or interposer therebetween may reduce the total volume of the PoP device 1. Also, the embodiments may reduce the warpage due to the coefficient of thermal expansion (CTE) mismatch between the packages and substrates by removing the substrate between the top package 12 and the bottom package 14.

An embodiment is a package-on-package (PoP) device comprising a bottom package on a substrate and a first set of conductive elements coupling the bottom package and the substrate. The embodiment further comprises a top package over the bottom package and a redistribution layer coupling the top package to the substrate.

Another embodiment is a PoP device comprising a substrate comprising metallization layers and a first package comprises a first set of conductive elements, the first set of conductive elements coupled to the metallization layers. The embodiment further comprises a second package over the first package, the second package comprising a second set of conductive elements and a plurality of redistribution layers over the first package, the plurality of redistribution layers coupling the second set of conductive elements to the metallization layers.

Yet another embodiment is a method of forming a PoP device comprising coupling a first package to a substrate; and forming a redistribution layer over the first package and a top surface of the substrate. The method further comprises coupling a second package to the redistribution layer, wherein the redistribution layer couples the second package to the substrate.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package-on-package (PoP) device comprising:
a bottom package on a substrate;
a first conductive contact on the substrate;
a first set of conductive elements coupling the bottom package and the substrate;
a top package over the bottom package;
a first redistribution layer on a top surface and a sidewall of the bottom package, wherein the first redistribution layer couples the top package to the substrate, and wherein the first redistribution layer comprises:
a first portion of the first redistribution layer being on the top surface of the bottom package, the first portion of the first redistribution layer having a top surface, a bottom surface opposite the top surface, and sidewalls extending from the top surface to the bottom surface of the first portion, the bottom surface of the first portion being in physical contact with the top surface of the bottom package;
a second portion of the first redistribution layer being along the sidewall of the bottom package, the second portion of the first redistribution layer having a sidewall in physical contact with a majority of the sidewall of the bottom package, the sidewall of the second portion of the first redistribution layer being substantially perpendicular to the bottom surface of the first portion of the first redistribution layer; and
a third portion of the first redistribution layer being on the first conductive contact on the substrate, the second portion of the first redistribution layer extending from the first to the third portions of the first redistribution layer, the third portion of the first redistribution layer having a top surface, a bottom surface opposite the top surface, and sidewalls extending from the top surface to the bottom surface of the third portion, the bottom surface of the third portion being in physical contact with a top surface of the first conductive contact;
a second redistribution layer on the top surface and a sidewall of the bottom package, wherein the second redistribution layer couples the top package to the substrate, and wherein the second redistribution layer comprises a first portion on the top surface of the bottom package, the first portion of the second redistribution layer having a top surface, a bottom surface opposite the top surface, and sidewalls extending from the top surface to the bottom surface of the first portion of the second redistribution layer;
an underfill material between the bottom package and the substrate, the second portion of the first redistribution layer having a sidewall in physical contact with a sidewall of the underfill material; and
a molding compound on a top surface of the substrate, between the bottom package and the top package and along sidewalls of the top package, the molding compound being in physical contact with the top surfaces and sidewalls of both the first portion and the third portion of the first redistribution layer, the molding compound further being in physical contact with the top surface and sidewalls of first portion of the second redistribution layer, the molding compound completely separating the first portion of the the first redistribution layer from the first portion of the second redistribution layer.

2. The PoP device of claim 1, wherein the first redistribution layer comprises:
a first end coupled to a conductive element of the top package; and
a second end coupled to the first conductive contact on the substrate.

3. The PoP device of claim 1 further comprising third redistribution layer and a fourth redistribution layer coupling the top package to the substrate.

4. The PoP device of claim 1, wherein the top package comprises more than one package.

5. The PoP device of claim 1, wherein the top package comprises passive components and a microelectromechanical systems (MEMS) sensor, at least one of the passive components being completely surrounded by the molding compound, the MEMS sensor having a top surface coplanar with a top surface of the molding compound.

6. The PoP device of claim 1, wherein the top package further comprises a second set of conductive elements coupling the top package to the first redistribution layer, and wherein the substrate further comprises metallization layers coupling the first redistribution layer to the first set of conductive elements.

7. The PoP device of claim 6, wherein the first set and second set of conductive elements are solder bumps, and wherein the substrate further comprises a plurality of under bump metallizations (UBMs) coupling the first set of conductive elements to the metallization layers of the substrate.

8. A PoP device comprising:
a substrate comprising metallization layers;
a first package comprising a first set of conductive elements, the first set of conductive elements coupled to the metallization layers;
an underfill material between the first package and the substrate;
a second package over the first package, the second package comprising a second set of conductive elements; a first redistribution layer directly contacting a top surface of the first package, a first sidewall of the first package, and a portion of the underfill material, the first redistribution layer consisting of:
a conductive seed layer on the first package and the substrate; and
a conductive layer on the conductive seed layer, the conductive layer having a first surface, a second surface, and a third surface, each of the first, second, and third surfaces being over the top surface of the first package, the first surface being substantially parallel to the top surface of the first package, the second and third surfaces being substantially perpendicular to the top surface of the first package, the first surface extending from the second surface to the third surface;
a second redistribution layer directly contacting the top surface and a second sidewall of the first package; and a molding compound surrounding the first and second packages, the molding compound being between the first and second packages and on a top surface of the substrate, the molding compound between the first and second packages completely separating the second redistribution layer from the first redistribution layer, the molding compound between the first and second packages extending along and directly contacting each of the first, second, and third surfaces of the conductive layer of the first redistribution layer.

9. The PoP device of claim 8, wherein the first package comprises two or more stacked chips coupled to each other.

10. The PoP device of claim 8, wherein the first and second set of conductive elements comprise solder bumps, the first set of conductive elements coupled to UBMs in the substrate, and the second set of conductive elements coupled to UBMs in at least one of the first and second redistribution layers.

11. A Package-on-Package (PoP) device comprising:
a first package on a substrate;
a first set of connector elements coupling the first package to the substrate;
a first redistribution layer directly contacting a top surface and a first sidewall of the first package, the first redistribution layer comprising:
 a conductive seed layer directly contacting the top surface and the first sidewall of the first package, the conductive seed layer directly contacting the substrate;
 a conductive layer on the conductive seed layer; and
 at least one under bump metallization (UBM) on the conductive layer;
a second redistribution layer directly contacting the top surface and a second sidewall of the first package, wherein the second redistribution layer is separated from the first redistribution layer by a molding compound;
a second package over the first redistribution layer and the second redistribution layer, the first redistribution layer and the second redistribution layer coupling the second package to the substrate;
at least one connector element coupling the second package to the first redistribution layer; and
at least another connector element coupling the second package to the second redistribution layer.

12. The PoP device of claim 11, wherein the second package comprises a third package and a fourth package, the third package being coupled to the first redistribution layer, and the fourth package being coupled to the second redistribution layer, wherein the third package and the fourth package are physically separated by the molding compound.

13. The PoP device of claim 11 further comprising:
an underfill material between the first package and the substrate, wherein the conductive seed layer of the first redistribution layer adjoins a portion of the underfill material; and
the molding compound surrounding the first and second packages, wherein the molding compound extends along sidewalls of the second package and is between the first and second packages and on a top surface of the substrate.

14. The PoP device of claim 1, wherein the first redistribution layer is conformal to the top surface and the sidewall of the bottom package, the sidewall of the underfill material, and the top surface of the substrate.

15. The PoP device of claim 8, wherein the top surface of the first package is substantially perpendicular to each of the four sides of the first package.

16. The PoP device of claim 11, wherein the second redistribution layer comprises:
a conductive seed layer on the first package and the substrate;
a conductive layer on the conductive seed layer; and
at least one under bump metallization (UBM) on the conductive layer.

17. The PoP device of claim 1 wherein the first redistribution layer is in direct contact with a first conductive element of the top package, and the second redistribution layer is in direct contact with a second conductive element of the top package, wherein the first conductive element and the second conductive element are different.

18. The PoP device of claim 3, wherein each of the first, second, third, and fourth redistribution layers are separated from one another by the molding compound.

19. A Package-on-Package (PoP) device comprising:
a passivation layer on a substrate;
at least one conductive contact on the substrate;
a first package over the substrate;
a plurality of conductive connector elements coupling the first package to the substrate;
a first conductor directly contacting a first portion of a top surface of the first package, a first sidewall of the first package, and the at least one conductive contact, the first conductor comprising:
 an outer surface;
 an inner surface opposite the outer surface;
 a lower end surface, the lower end surface overlying the at least one conductive contact; and
 an upper end surface, the upper end surface overlying the first portion of the top surface of the first package;
a second conductor directly contacting a second portion of the top surface of the first package and a second sidewall of the first package, the second conductor comprising an upper end surface overlying the second portion of the top surface of the first package;
a second package over the first conductor and the second conductor, the first conductor and the second conductor coupling the second package to the substrate;
a first conductive connector element coupling the second package to the first conductor;
a second conductive connector element coupling the second package to the second conductor; and
a molding compound over the substrate, the first package, and the second package, the molding compound directly contacting the passivation layer, the lower end surface of the first conductor, the outer surface of the first conductor, the upper end surface of the first conductor, a sidewall and a top surface of the second package, and the upper end surface of the second conductor, wherein the upper end surface of the first conductor and the upper end surface of the second conductor are separated by the molding compound.

20. The PoP device of claim 19, wherein the first conductor further comprises:
a conductive seed layer directly contacting the first portion of the top surface of the first package, the first sidewall of the first package, and the at least one conductive contact;
a conductive layer on the conductive seed layer; and at least one under bump metallization (UBM) on the conductive layer on the first portion of the top surface of the first package.

21. The PoP device of claim 1, wherein the first redistribution layer consists essentially of conductive material.

22. The PoP device of claim 1, wherein the second portion of the first redistribution layer comprises a first section and a second section, the first section having a first sidewall in physical contact with the majority of the sidewall of the bottom package, the second section having a second sidewall in physical contact with the sidewall of the underfill material, the first sidewall and the second sidewall extending in different directions, the bottom surface of the third portion of the first redistribution layer extending in a different direction than both the first sidewall and the second sidewall of the second portion of the first redistribution layer.

* * * * *